United States Patent
Sahara et al.

(10) Patent No.: US 7,078,928 B2
(45) Date of Patent: Jul. 18, 2006

(54) SEMICONDUCTOR INTEGRATED CIRCUIT DEVICE

(75) Inventors: Ryusuke Sahara, Ome (JP); Kozaburo Kurita, Ome (JP); Yuuji Suzuki, Oi (JP); Mitsugu Kusunoki, Kunitachi (JP); Hideki Sakakibara, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 71 days.

(21) Appl. No.: 10/736,673

(22) Filed: Dec. 17, 2003

(65) Prior Publication Data

US 2004/0128635 A1    Jul. 1, 2004

(30) Foreign Application Priority Data

Dec. 19, 2002    (JP)    ............... 2002-367462

(51) Int. Cl.
    H03K 19/00    (2006.01)
    G01R 31/28    (2006.01)
    H03H 11/26    (2006.01)
(52) U.S. Cl. .................. 326/16; 714/726; 327/270
(58) Field of Classification Search .................. 326/16; 714/726; 327/170, 270, 276, 291, 293
    See application file for complete search history.

(56) References Cited

U.S. PATENT DOCUMENTS 5,783,960 A * 7/1998 Lackey ................. 327/295
6,452,435 B1 * 9/2002 Skergan et al. ............. 327/293

FOREIGN PATENT DOCUMENTS

JP    7-84011    3/1995
JP    2001-91590    4/2001

* cited by examiner

*Primary Examiner*—Daniel Chang
(74) *Attorney, Agent, or Firm*—Antonelli, Terry, Stout and Kraus, LLP.

(57) ABSTRACT

The present invention provides a semiconductor integrated circuit device equipped with at least one pulse generator which generates a pulse of a pulse with shorter than a rising time up to the full amplitude of a transfer signal.

A first signal and a second signal supplied from outside through a first signal path and a second signal path are respectively transferred to the pulse generator. When a rising time up to the full amplitude at any one of buffers in the first signal path and the second signal path is longer than a pulse width of a pulse to be formed by the pulse generator, the difference in phase between the first signal and the second signal is caused to correspond to a pulse width of a first pulse.

8 Claims, 11 Drawing Sheets

FIG.5

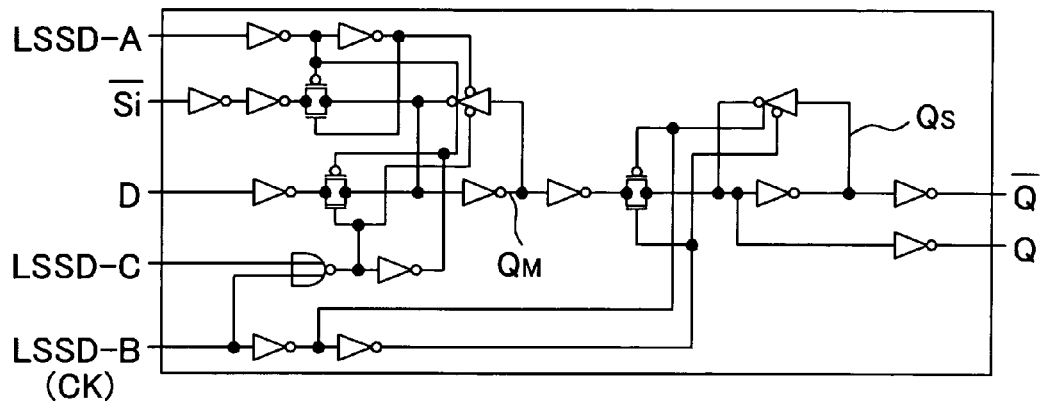

FIG.6

| INPUT | | | | | INTERMEDIATE NODE | | OUTPUT | | NOTE |
|---|---|---|---|---|---|---|---|---|---|
| CK | D | LSSD-A | LSSD-C | $\overline{Si}$ | QM | Qs | Q | $\overline{Q}$ | NORMAL |
| L | * | L | L | * | D | Qs-1 | Qs | $\overline{Qs}$ | NORMAL |
| H | * | L | L | * | QM-1 | QM | Qs | $\overline{Qs}$ | NORMAL |
| ⎍ | L | L | L | * | L | QM | L | H | NORMAL |
| ⎍ | H | L | L | * | H | QM | H | L | NORMAL |
| L | * | L | H | * | QM-1 | Qs-1 | Qs | $\overline{Qs}$ | DIAGNOSTIC |
| H | * | L | H | * | QM-1 | QM | Qs | $\overline{Qs}$ | DIAGNOSTIC |
| L | * | H | H | L | H | Qs-1 | Qs | $\overline{Qs}$ | DIAGNOSTIC |
| L | * | H | H | H | L | Qs-1 | Qs | $\overline{Qs}$ | DIAGNOSTIC |
| * | * | H | L | * | | | | | PROHIBITED |
| H | * | H | H | * | | | | | PROHIBITED |

US 7,078,928 B2

SEMICONDUCTOR INTEGRATED CIRCUIT DEVICE

BACKGROUND OF THE INVENTION

1. Field of the Invention

The present invention relates to a semiconductor integrated circuit device, and to, for example, a technology effective if applied to an AC test technique for a semiconductor integrated circuit device equipped with a logic circuit having clock distribution routes with equivalent lengths.

2. Description of the Prior Art

Japanese Published Unexamined Patent Application No. Hei 07(1995)-084011 discloses a clock generator for scan test, which, in order to perform a scan test on an internal logic circuit in a short period of time, combines signals A, B and C formed by dividing a continuous clock and thereby generates a first scan test clock inputted to a slave latch of a scan test circuit constituted by latches in which flip-flops are connected in series, and a second scan test clock inputted to a master latch of the scan test circuit. A technology for forming each internal clock using a PLL circuit, causing a combination circuit to output a first clock pulse corresponding to the internal clock in a test mode to transmit an input signal to a logic stage used as a combination circuit, generating a second clock pulse corresponding to the internal clock to fetch an output signal of the logic stage into its corresponding flip-flop FF, thereby recovering a test result by use of a scan circuit has been disclosed in Japanese Published Unexamined Patent Application No. Hei 2001-091590.

SUMMARY OF THE INVENTION

Both of the prior arts referred to above are capable of testing only by the frequencies of the pre-determined clocks. Further, there is a need to design the combination circuits one by one in association with a logic circuit, operating frequencies and clocks to be used, and hence the number of man-hours for design increases. It is therefore considered that each pulse having a required pulse width is supplied from outside. However, a transmittable pulse width is limited by a rising time up to full amplitude at a signal path, and hence the pulse of the required pulse width cannot be formed. Therefore, the inventors or the like of the present application have led the development of such a clock distribution circuit as to be capable of verifying even a timing margin of a high-speed logic circuit by use of timing pulses supplied from outside.

An object of the present invention is to provide a semiconductor integrated circuit device equipped with at least one pulse generator for generating a pulse of a pulse width shorter than a rising time up to the full amplitude of a transfer signal. Another object of the present invention is to provide a semiconductor integrated circuit device equipped with a test clock distribution circuit that enables a high-performance test operation. The above, other objects and novel features of the present invention will become apparent from the description of the present Specification and the accompanying drawings.

A summary of a representative one of the inventions disclosed in the present application will be described in brief as follows: A first signal and a second signal supplied from outside through a first signal path and a second signal path are respectively transferred to a pulse generator. When a rising time up to the full amplitude at any one of buffers in the first signal path and the second signal path is longer than a pulse width of a pulse to be formed by the pulse generator, the difference in phase between the first signal and the second signal is caused to correspond to a pulse width of a first pulse.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 5 is a circuit diagram showing one embodiment of an LSSD type flip-flop employed in the semiconductor integrated circuit device according to the present invention;

FIG. 6 is a truth value diagram for describing the operation of the LSSD type flip-flip shown in FIG. 5;

DETAILED DESCRIPTION OF THE PREFFERED EMBODIMENTS

Figure 1:
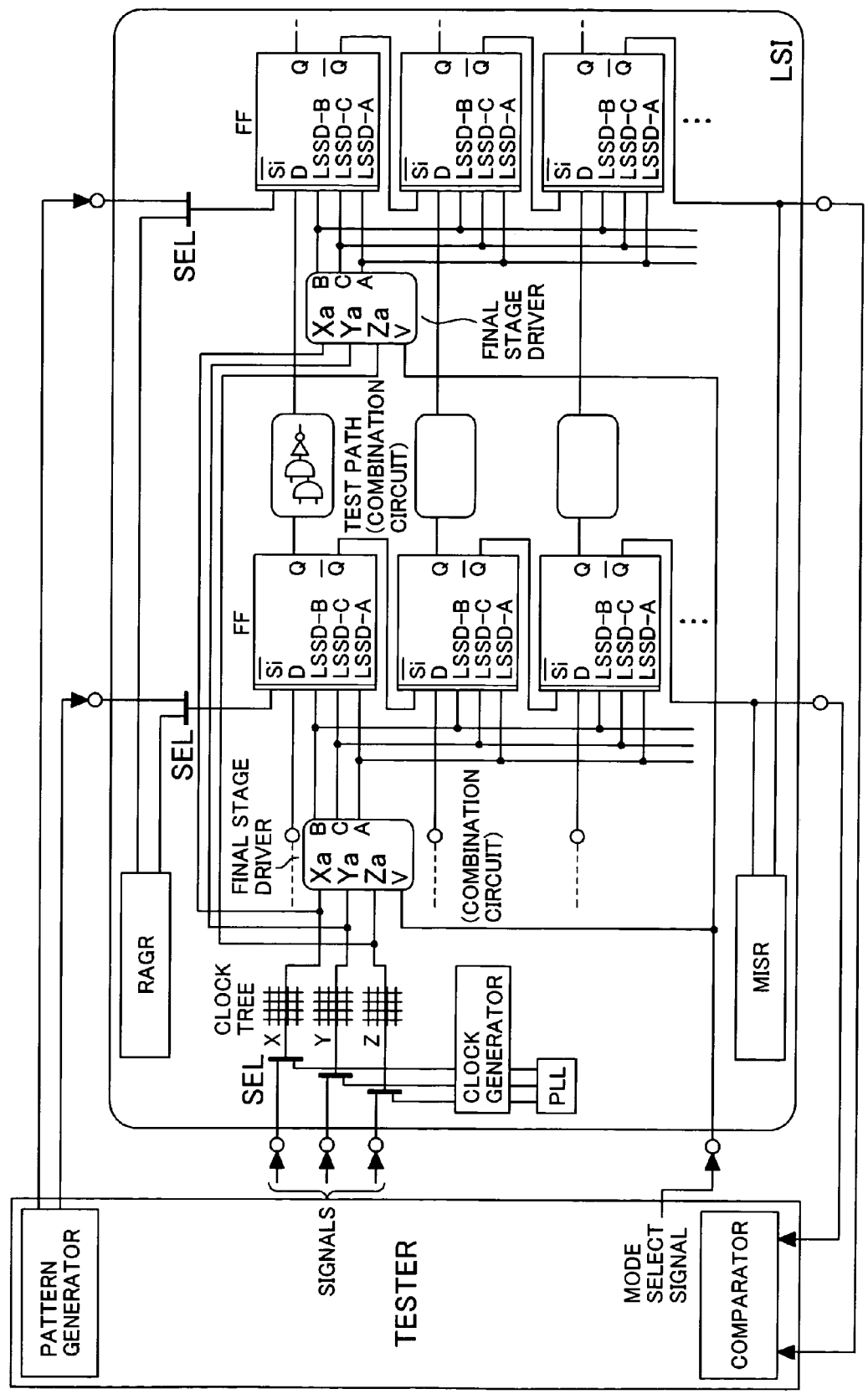
FIG. 1 is a fragmentary block diagram showing one embodiment of a semiconductor integrated circuit device according to the present invention.

A fragmentary block diagram of one embodiment of a semiconductor integrated circuit device according to the present invention is shown in FIG. 1. The present embodiment is configured so as to perform an AC test of each logic circuit (user logic) by use of clock pulses supplied from outside. A clock tree is provided for a high-speed operation of the logic circuit. The clock tree comprises such a signal transmission system that clock pulses formed by application of signals from external terminals or by a clock generator are supplied to respective flip-flops FFs of combination circuits with mutually-equal delay times. The clock tree is made up of, for example, clock wirings equal in length, and clock buffers (buffers) set to the same number of stages. Thus, the flip-flops FFs constituting the logic circuit supplied with clock pulses of respective phases, are supplied with clock pulses having propagation delay time differences identical to one another, so that clock pulse skew is reduced, thereby allowing the logic circuit to operate by clock pulses of a high frequency.

A basic configuration of the logic circuit is constituted by combinations with the flip-flops FFs, combination circuits (test paths) and flip-flops FFs as units. Upon a normal operation, a signal retained in each flip-flop FF provided on the input side of the combination circuit is inputted to the corresponding combination circuit in synchronism with the clock pulse. The combination circuit performs logical processing in accordance with the input signal and transmits the result of logic processing to an input terminal of its corresponding flip-flop FF provided on the output side of the combination circuit. The flip-flop FF on the output side thereof fetches and retains the signal outputted from the combination circuit in synchronism with the following clock pulse. A logical sequence synchronized with the clock pulse is executed in this way.

The flip-flop FF comprises an LSSD type flip-flop and has a scan input terminal/Si in addition to an input terminal D. Further, it includes three clock input terminals LSSD-A, LSSD-B and LSSD-C. Upon the normal operation, the flip-flop FF fetches and retains a signal in accordance with a clock pulse of one phase supplied from the clock terminal LSSD-B. At this time, the clock terminals LSSD-A and LSSD-C are respectively fixed to a low level. Upon a scan-in operation for inputting each test pattern used for the AC test or a scan-out operation for outputting the result of testing, shift operations of the flip-flops FFs connected in a series configuration with one another via the scan input terminals/ Si are performed in synchronism with clock pulses of two phases at their clock terminals LSSD-B and LSSD-A.

Upon the AC test operation, the test signals retained in the respective flip-flops FFs are outputted to their corresponding combination circuits in synchronism with the rising edges at the clock terminals LSSD-B, and output signals from the combination circuits to the input terminals D are respectively fetched in accordance with the rising edges at the clock terminals LSSD-C. At this time, each clock terminal LSSD-B is supplied with a positive pulse and each clock terminal LSSD-C is supplied with a negative pulse. There is a need to set the positive and negative pulses such that their active levels non-overlap.

In order to execute the AC test of the above logic circuit by use of each of such LSSD type flip-flops, a test input signal is supplied to the corresponding flip-flop FF provided on the input side of the combination circuit by the scan-in operation. After the completion of setting of the test input signal, a first clock pulse (LSSD-B) is supplied and the test input signal fetched into the flip-flop FF is supplied to the combination circuit. Then a second clock pulse (LSSD-C) for fetching an output signal corresponding to it into the flip-flop FF is supplied. However, a problem arises in that when an attempt is made to transfer a pulse having a pulse width shorter than a rising time up to the full amplitude by way of the clock tree as described above, the pulse is lost or made extinct as will be described later, and an AC test for a high-speed logic circuit cannot be performed.

In the present embodiment, a pulse generator is provided at the final stage driver of the clock tree to generate a pulse shorter than a rising time up to the full amplitude by way of the clock tree as described above. That is, the final stage driver shares a pulse generator in addition to the function of a clock buffer. The final stage driver performs according to a mode selection signal the operation of passing a continuous pulse supplied via the above clock tree therethrough, and operates as a pulse generator for generating one shot pulse.

The semiconductor integrated circuit device LSI according to the present embodiment includes the logic circuits each comprising the flip-flops FFs and combination circuits (test paths) referred to above, a PLL circuit and a clock generator in addition to the clock tree for supplying the clock pulses thereto and the final stage drivers. Thus, the clock pulses supplied from the external terminals or the clock pulses of the built-in clock generator are selectively used in the clock tree. For instance, the semiconductor integrated circuit device is supplied with testing clock pulses from the external terminals upon a test operation and operated by clock pulses formed by the clock generator upon the normal operation. Even upon the normal operation if necessary, the semiconductor integrated circuit device may be operated by the clock pulses supplied from the external terminals.

A tester includes a pattern generator and a comparator. Test patterns generated by the pattern generator are serially inputted to the flip-flops FFs and thereafter the above-described AC test is performed. The test results are recovered by the comparator, where they are compared with expected values corresponding to the test patterns and whether they are good or bad is determined. RAGR is a test pattern generator which includes a random pattern generating circuit and generates test patterns. Such test results obtained thereinside corresponding to the test patterns are compressed by a multiple input signature register MISR and the result of determination is transferred to the tester. When such a test circuit is built in the semiconductor integrated circuit device, the load on the tester is lightened and hence many semiconductor integrated circuit devices can be simultaneously tested. In order to perform such a test operation, selectors SEL are provided at input portions of the clock tree and serial input portions of first stages of the series-connected flip-flops FFs.

Figure 2:
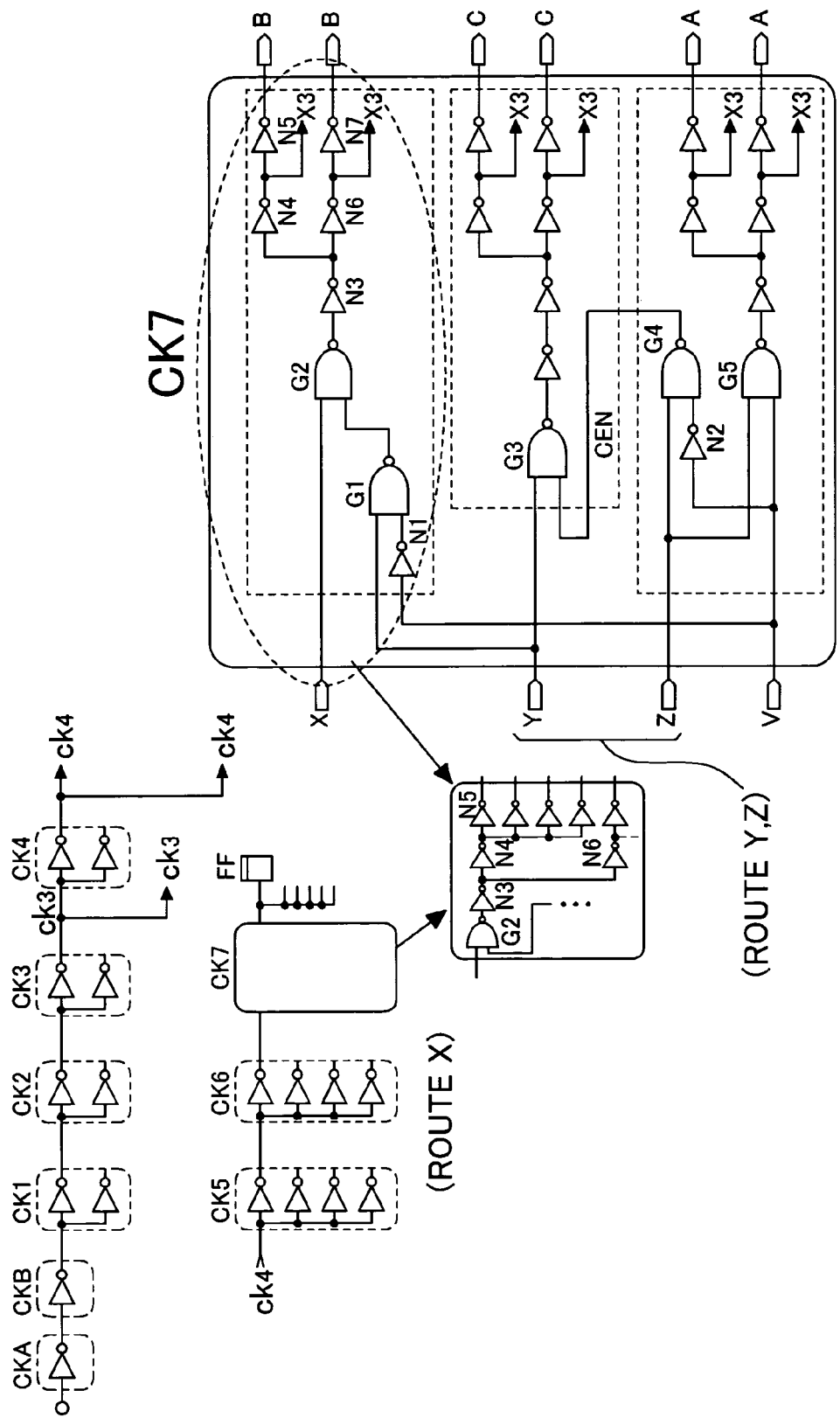
FIG. 2 is a block diagram illustrating one embodiment of a clock distribution circuit of the semiconductor integrated circuit device according to the present invention.

A block diagram of one embodiment of a clock distribution circuit of the semiconductor integrated circuit device according to the present invention is shown in FIG. 2. The clock distribution circuit comprises clock distribution routes corresponding to 3 routes constituent of X, Y and Z. One (route X) is illustratively shown in the same figure as a representative up to the final stage CK7. The final stage CK7 includes a pulse generating function in addition to being operated as the above clock buffer (amplification). Therefore, the final stage CK7 performs the operation of amplifying an input clock pulse and transmitting it and the operation of processing the input pulse to form a pulse different from it and outputting it.

A clock supplied from an external terminal is inputted through clock buffers CKA and CKB and transmitted to the final stage driver CK7 via respective buffers of CK1 through CK6. As will be described later, the distances to the final stage CK7 are set so as to be equal in length and the buffers are set so as to take the same number of stages. The clock is branched or divided by the buffers at the respective stages, and thereby clock pulses are propagated. The final stage driver CK7 is supplied with an input signal V corresponding to the mode select signal in addition to the three input signals X, Y and Z. Since the signal V is of a select signal, the mode select signal is transmitted to all the final stages suitably and according to need via the buffers without via the above clock tree.

The final stage driver CK7 basically comprises four stages combination circuits of a gate circuit G2 and inverter circuits N3, N4 and N5. Since these combination circuits are short in wiring length or each load capacitance to be driven is lighter than each of the clock buffers CK1 through CK6, the rising edge of an output signal can be made steep. The number of stages of the clock tree is eight inclusive of the input buffer, whereas the maximum number of combination circuits at the final stage driver CK7 is reduced to five in the case of a Y-B route and a Y-C route, and to six in the case of a Z-C route.

The final stage driver CK7 has a through mode in which the input signals X, Y and Z are outputted as they are in accordance with a high level of the mode select signal V, and a clock advance mode in which pulses corresponding to phase differences developed among the rising edges of the input signals X, Y and Z are formed in accordance with a low level of the mode select signal V. The through mode is used in the scan-in and scan-out operations at the normal and test operations, whereas the clock advance mode is used in the AC test at the test operation. An output B of the final stage driver CK7 corresponds to the clock terminal LSSD-B of the LSSD type flip-flop FF, an output C of the final stage driver CK7 corresponds to the clock terminal LSSD-C of the LSSD type flip-flop FF, and an output A of the final stage driver CK7 corresponds to the clock terminal LSSD-A of the LSSD type flip-flop FF, respectively.

Figure 3:
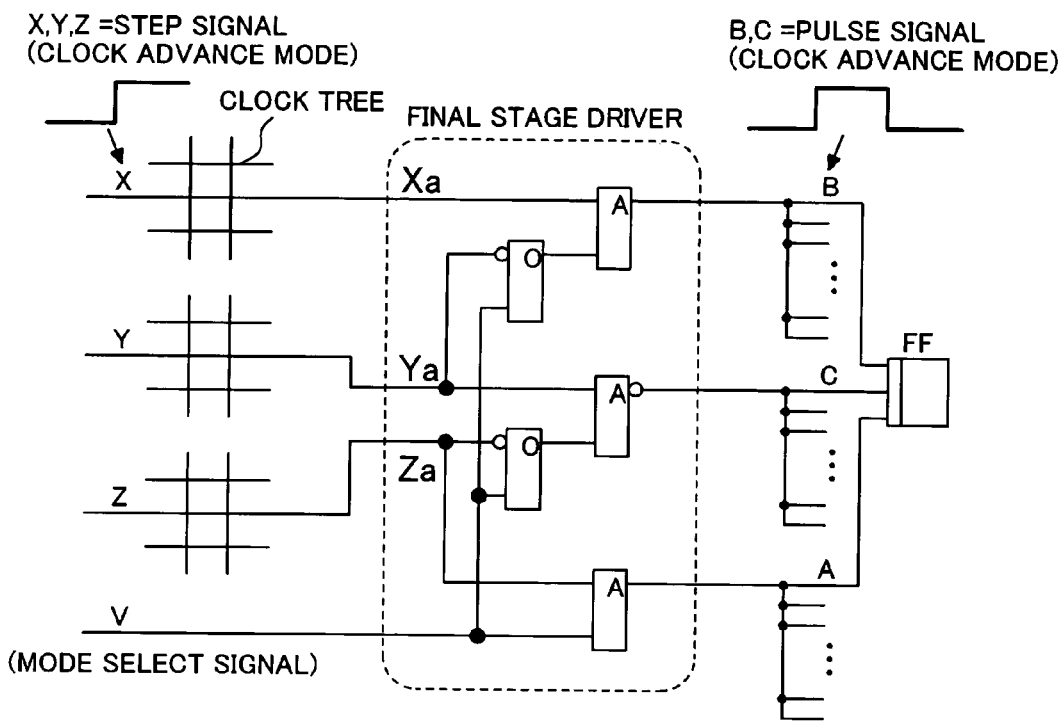
FIG. 3 is a block diagram depicting one embodiment of a clock distribution circuit of the semiconductor integrated circuit device according to the present invention.

A block diagram of one embodiment of a clock distribution circuit of the semiconductor integrated circuit device according to the present invention is shown in FIG. 3. In the present embodiment, the clock distribution circuit and the relation up to the flip-flop FF supplied with clocks by the clock distribution circuit are shown. That is, the three clock pulses corresponding to the clock terminals LSSD-B, LSSD-C and LSSD-A are transmitted to the corresponding flip-flop. In the final stage driver, circuits A indicate simplified circuits of the logic gate circuits G2, G3 and G5 or the like shown in FIG. 2, and circuits 0 indicate simplified circuits of gate circuits G1+N 1, G4+N2, etc.

A clock system from the input buffers CKA and CKB to the final stage driver CK7 is provided with clock distribution routes corresponding to three routes of X, Y and Z. These clock distribution routes corresponding to the three routes are made equal in wiring length and disposed adjacent to one another in order to make them equal to one another in length. Clock drivers are also disposed adjacent to one another. Although not restricted in particular, since the clock used upon the normal operation is a clock pulse X corresponding to the LSSD-B, signal wirings and clock buffers corresponding to Y and Z are disposed adjacent to each other so as to interpose a signal wiring and a clock buffer for transmitting the X therebetween. Upon the normal operation, the signal X is utilized such that the signal wirings of Y and Z are caused to have a shield effect for eliminating capacitive coupling to other signal wiring for the signal X.

Figure 4:
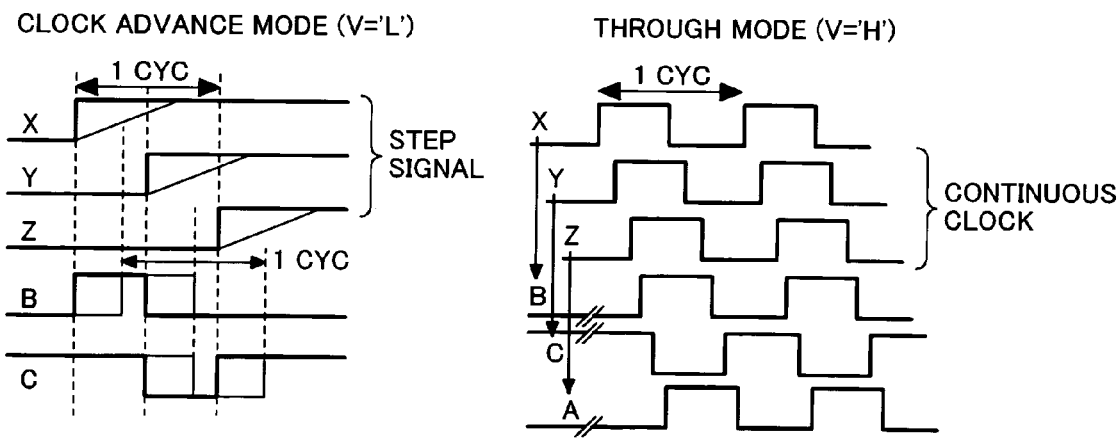
FIG. 4 is a waveform diagram for describing the operation of a final stage driver according to the present invention.

A waveform diagram for describing the operation of the final stage driver according to the present invention is shown in FIG. 4. In the clock advance mode, a select signal V is brought to a low level (L). At this time, step signals which signals X, Y and Z change from low to high levels in that order, are inputted. Thus, a pulse B corresponding to the difference in phase between the rising edge of the signal X and the rising edge of the signal Y is formed at the final stage driver. Then a pulse C corresponding to the difference in phase between the rising edge of the signal Y and the rising edge of the signal Z is formed. The pulse B is set as a positive pulse and the pulse C is set as a negative pulse.

In the present embodiment, even if the rising edge of the full amplitude is slower than the pulse widths of the pulses B and C, a pulse of one cycle (cyc) corresponding to each of the step signals X, Y and Z can be formed in the clock tree up to the final stage driver. Even if the rising times of the step signals transmitted to the final stage driver become longer than the pulse width of the pulse signal B or C as indicated by thin lines, for example, the difference in phase between the signals each reaching a logic threshold voltage at the corresponding logic circuit subjected to it is not under its influence. Therefore, while each signal is delayed by only the time required to reach the logic threshold voltage, the pulses B and C of one cycle (cyc) necessary for the AC test can be produced.

In the through mode, the select signal V is brought to a high level (H). In the through mode, continuous pulses corresponding to input signals X, Y and Z are outputted. However, an output signal C corresponding to the signal Y results in a pulse whose phase is inverted. In the through mode, the three pulses are not inputted simultaneously as shown in the same figure. Alternatively, as will be described later, clocks of two phases corresponding to the serial scan operation at the flip-flop FF or a clock of one phase at the normal operation is inputted from the corresponding external terminal.

A circuit diagram of one embodiment of the LSSD type flip-flop employed in the semiconductor integrated circuit device according to the present invention is shown in FIG. 5. The flip-flop circuit according to the present embodiment comprises a normal operation section wherein two latches are provided between an input terminal D and an output Q (/Q), and the two latches are caused to complementarily input and retain data in accordance with a clock of one phase inputted from a clock terminal LSSD-B, and a scan operation section wherein two latches are provided between a scan input terminal/Si and the output Q (/Q), and the pre-stage latch is operated by a clock inputted from a clock terminal LSSD-A and the subsequent-stage latch is operated by the clock inputted from the clock terminal LSSD-B.

A truth-value diagram for explaining the operation of the LSSD type flip-flop of FIG. 5 is shown in FIG. 6. A clock CK shown in the same figure corresponds to the clock terminal LSSD-B. The present flip-flop circuit performs one-phase and two-phase clock operations and the operation corresponding to the step signals in association with the three clock terminals LSSD-B, LSSD-A and LSSD-C for the clocks respectively supplied in the through mode and clock advance mode at the final stage driver.

Figure 7:
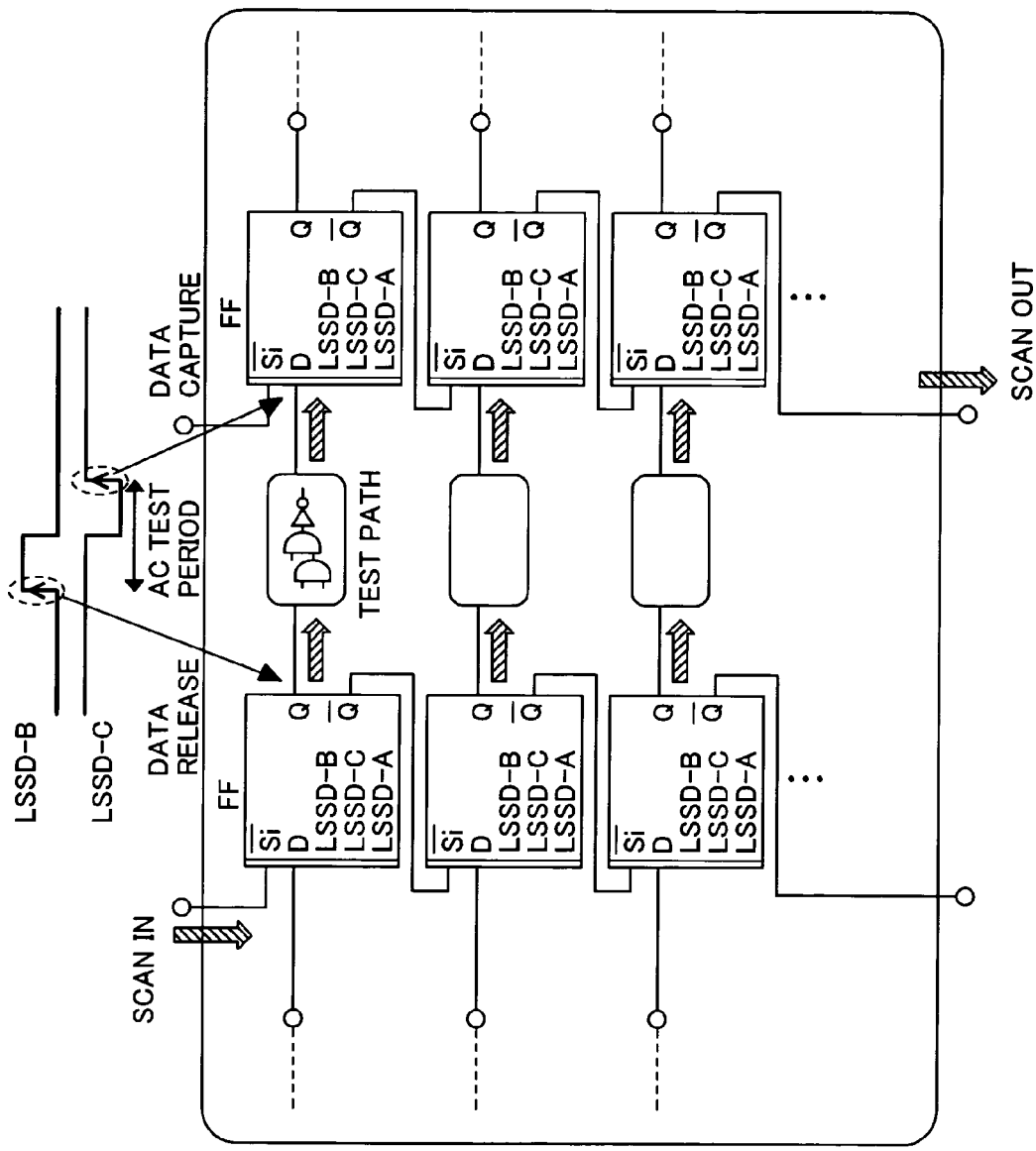
FIG. 7 is a block diagram for describing an AC test operation of each combination circuit employed in the semiconductor integrated circuit device according to the present invention.

A block diagram for describing an AC test operation of each combination circuit employed in the semiconductor integrated circuit device according to the present invention is shown in FIG. 7. Test paths (combination circuits) are respectively disposed between the outputs of flip-flops and the inputs of flip-flops. The plurality of flip-flops, which form signals to be inputted to the combination circuits, are serially connected by use of their serial input terminals/Si and serially inputted with test patterns from a scan-in terminal (SCAN IN). Signals outputted from the combination circuits are transferred to their corresponding input terminals D of the plurality of flip-flops. The flip-flops corresponding to these output signals are serially connected using their serial input terminals/Si and serially transfer output signals to a scan out terminal (SCAN OUT).

Since an actual logic circuit is configured such that a plurality of stages of flip-flops are provided with combination circuits, the flip-flops set as the input side are regarded as the output side as viewed from the combination circuits provided at their input portions. Therefore, the output signal of the pre-stage combination circuit is scanned out upon the scan-out operation. The flip-flops set as the output side are regarded as the flip-flops for inputting the test patterns as viewed from the combination circuits provided in their subsequent stages in reverse. Thus, the illustrated flip-flops configured in the two rows may be connected so as to constitute scan circuits provided in one row, thereby performing fetching of the test patterns and a scan-out operation for output signals. As to the scan circuits in this way, the flip-flops may be connected so as to constitute one scan circuit over the whole logic circuit.

Figure 8:
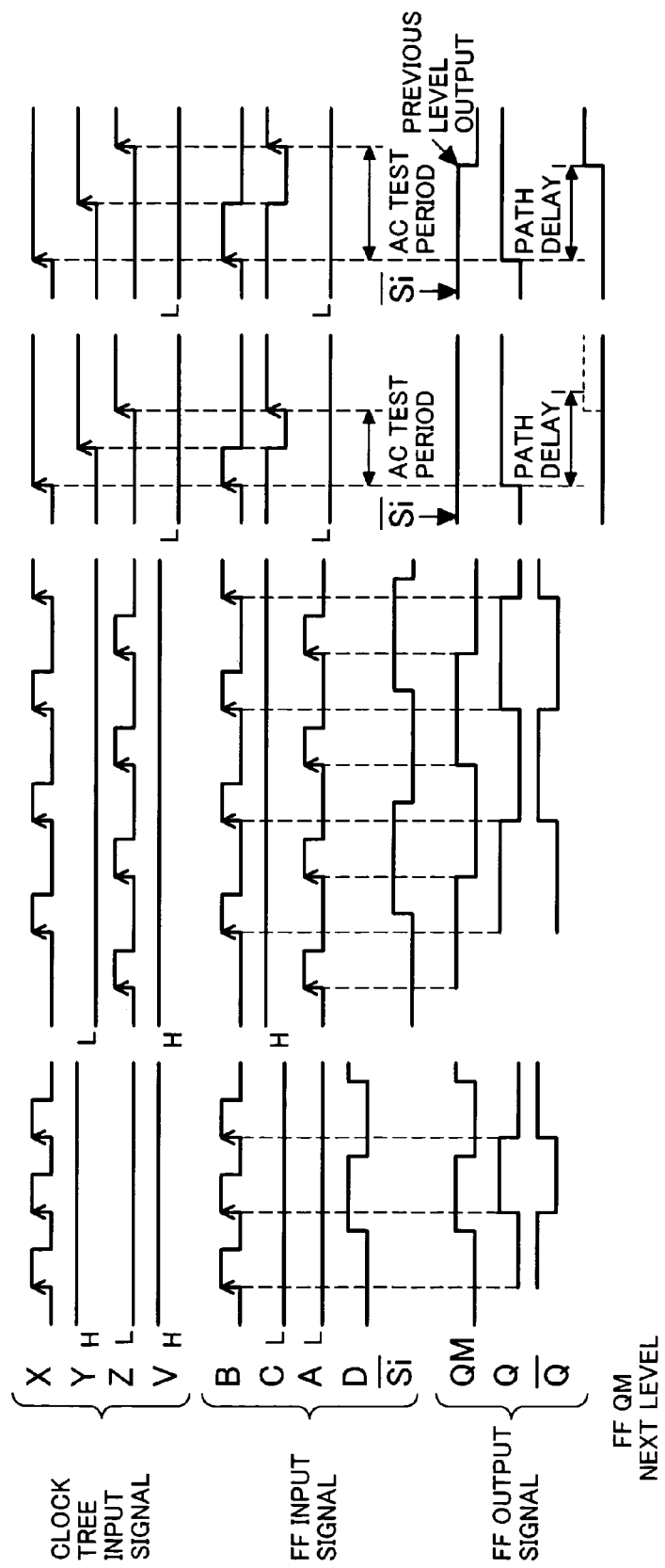
FIGS. 8A to 8D are waveform diagrams for describing the operations of the final stage driver and LSSD type flip-flop according to the present invention.

A waveform diagram for explaining the operations of the final stage driver and LSSD type flip-flop according to the present invention is shown in FIG. 8. (A) and (B) respectively show waveform diagrams when the final stage driver is set to a through mode. Therefore, select signals V are both set to a high level (H). (C) and (D) respectively show waveform diagrams when the final stage driver is set to a clock advance mode. Therefore, the select signals V are set to a low level (L).

(A) illustrates a waveform diagram at the normal operation. As to signals inputted from a clock tree, a continuous clock pulse is supplied to a signal line X, a signal line Y is fixed to a high level (H) and a signal line Z is set to a low level (L). Since the signal line X is formed with being interposed between the signal lines Y and Z, coupling made from other signal lines extending in parallel with a clock wiring does not occur, and hence a phase shift of the clock can be set to the minimum. In the flip-flop FF at this time, the clock pulse transferred from the signal line X is passed through so as to be transmitted to the clock terminal CK (LSSD-B). An output signal Q (/Q) corresponding to an input signal D is formed in synchronism with such a clock CK.

(B) shows a waveform diagram at scan-in/scan-out operations. As to signals inputted from the clock tree, continuous clock pulses of two phases are supplied to the signal lines X and Z, and the signal line Y is fixed to a low level (L). The clock pulse of two phases from the signal line X and Z are transmitted to each of the clock terminals LSSD-B and LSSD-A, and an input signal from the scan terminal/Si is sequentially shifted half bit by half bit in synchronism with such two-phase clock.

(C) and (D) respectively show waveform diagrams at an AC test operation. A pulse B (LSSD-B) and a pulse C (LSSD-C) are formed in association with the differences in rising phase among step waveforms supplied from the signal lines X, Y and Z. With the rising edge of the pulse B, the flip-flop FF sends an output signal and takes in an input signal on the rising edge of the pulse C. This difference in time is called an AC test period. (C) corresponds to the case in which a path delay of a combination circuit is longer than the AC test period, and (D) corresponds to the case in which the path delay of the combination circuit is shorter than the AC test period. When the path delay is longer than the AC time period as in (C), a logic output formed at the combination circuit is not transferred to the flip-flop. Therefore, this leads to a state of a failure in path delay.

In the present embodiment, when the failure in path delay has occurred as in (C), the path delay at the combination circuit can be verified by making a phase-difference adjustment, like the phase differences (D) among the input signals X, Y and Z. The phase differences among X, Y and Z may be set shorter than the normal path delay to perform testing, thereby assuring a timing margin. Alternatively, the maximum value of the path delay may be determined to assure the highest frequency at which the semiconductor integrated circuit device operates.

In the present embodiment, an arbitrary pulse of a pulse width shorter than the rising time up to the full amplitude of a waveform at the corresponding signal path can be formed based on the phase difference between the step signals from the external terminals. An AC test on a high-speed logic circuit can be simply performed.

Figure 9:
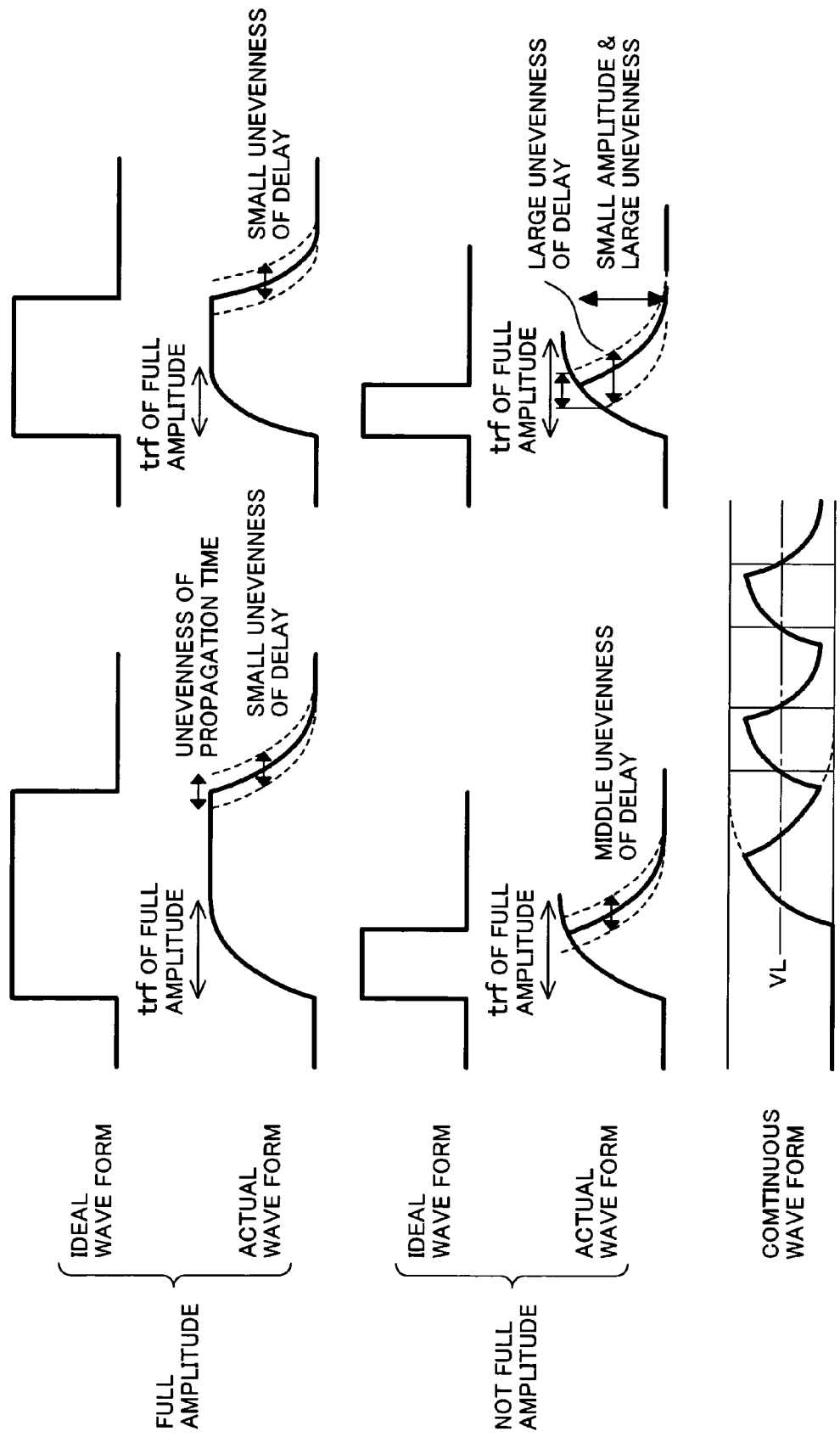
FIG. 9 is a waveform diagram at a clock signal path, for describing the present invention.

A waveform diagram at a clock signal path, for describing the present invention is shown in FIG. 9. An actual waveform transmitted based on the output impedance of a driver, distributed resistance and distributed capacitance at a wiring path, and input capacitance of a load circuit, etc. becomes slow with respect to an ideal waveform by trf in rising time up to the full amplitude. However, when such a relatively broad pulse width that the level falls after its rise to the full amplitude is transmitted, dispersion of delay occurs corresponding to dispersion of propagation time with each-full amplitude level as the reference. Therefore, the pulse width is dispersed within a relatively small range. Accordingly, if waveform shaping is done by the final stage driver, then a pulse close to the ideal waveform can be formed.

However, when the pulse width of the ideal waveform is shorter than the rising time up to the full amplitude, in other words, when the pulse width to be transmitted is shorter than the rising time, the pulse changes to its fall in the course of its rise, and a delay dispersion component at the rising edge is contained in dispersion of delay thereat. Therefore, the dispersion of delay becomes larger than the dispersion of propagation time. With a change to the fall of a pulse in the course of its rise, the pulse width becomes narrow at a buffer that receives it. Similarly, the pulse falls in the course of its rise even when the pulse is transmitted to the next-stage buffer, and hence the pulse width becomes smaller. The pulses will disappear in this way while being transmitted via a multi-stage clock tree. Alternatively, even if the pulse per se does not disappear, the influence of the dispersion of delay becomes significant and a highly accurate AC test cannot be performed.

When a continuous pulse is transmitted even in the same signal path in contrast, a triangular signal of small amplitude is sequentially transmitted with a logic threshold voltage of a buffer as the center. Since the triangular signal is formed substantially symmetrically with the logic threshold voltage, waveform shaping thereof based on the logic threshold voltage is done at the final stage, so that a clock pulse having a pulse width similar to an input waveform can be reproduced as indicated by a thin line in the same figure. That is, in the case of a continuous waveform, a pulse of a pulse width shorter than the rising time trf up to the full amplitude at the signal path can be transmitted to the corresponding flip-flop. By paying attention to this, the input signals are set as step signals upon AC testing while being used in the same signal path, and the corresponding pulse is generated based on the difference in phase therebetween, whereby a test on each combination circuit is performed under the same condition as an actual operation.

Figure 10:
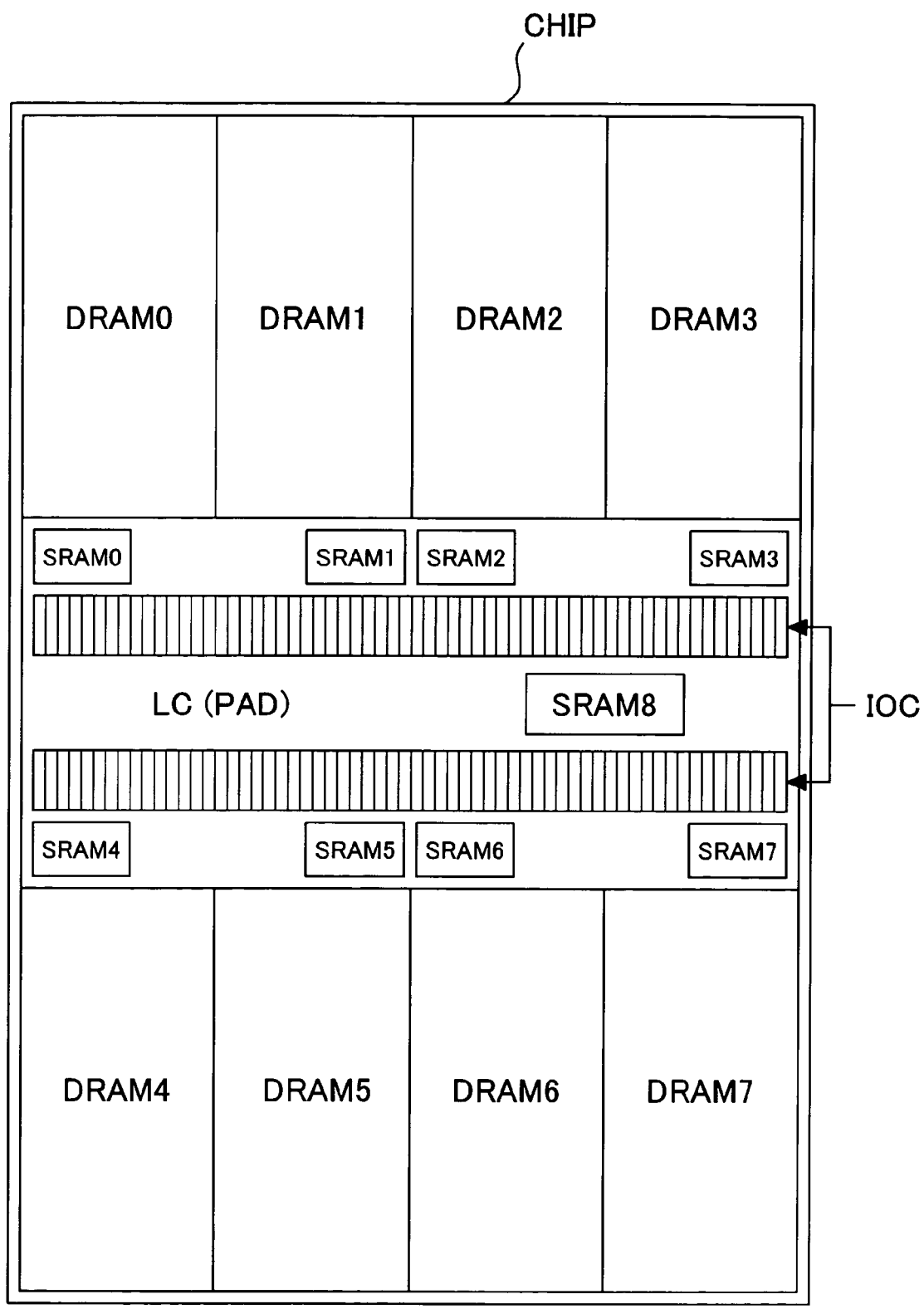
FIG. 10 is a substrate layout diagram showing one embodiment of a logic embedded memory LSI according to the present invention.

A substrate layout diagram of one embodiment of a logic embedded memory LSI (semiconductor integrated circuit device) according to the present invention is shown in FIG. 10. The semiconductor integrated circuit device of the present embodiment is formed on one semiconductor substrate by the known semiconductor technology. Although not restricted in particular, the semiconductor integrated circuit device of the present embodiment is mounted on a predetermined board of a computer system so as to configure its cache memory, for example.

Referring to FIG. 10, the logic embedded memory LSI of the present embodiment includes, although not restricted in particular, memory banks corresponding to eight in total, which comprise four circuit blocks, i.e., DRAM macro cells DRAM0 through DRAM3 disposed on the side of an upper side of a semiconductor substrate CHIP, and four circuit blocks, i.e., DRAM macro cells DRAM4 through DRAM7 disposed on the side of a lower side thereof. The memory banks (DRAM macro cells) are respectively equipped with address buffers (latches) so as to be capable of memory access independently respectively as will be described later.

The logic embedded memory LSI further includes eight SRAM macro cells SRAM0 through SRAM7 respectively disposed inside the DRAM macro cells, and another SRAM macro cell SRAM8 disposed in the central portion of the semiconductor substrate CHIP. A number of input output cells IOCs are disposed in row form inside the SRAM macro cells SRAM0 through SRAM3 and the SRAM4 through SRAM7 along the transverse center line of the semiconductor substrate CHIP. A logic part LC containing a number of gate arrays and pads PADs corresponding to chip terminals not shown in the drawing is disposed between these input output cells IOCs and the SRAM macro cell. The gate arrays of the logic part LC are combined based on user specs and constitute predetermined logic circuits. Also the pads PADs are coupled to their corresponding bumps via wiring layers formed in a package.

The input/output of data from and to the DRAM macro cells DRAM0 through DRAM7 via the input output cells IOCs, i.e., the writing and reading of data into and from the DRAM macro cells DRAM0 through DRAM7 are performed through the SRAM macro cells. Interposing such SRAM macro cells and using them as buffers enables high-speed writing and reading of data. By using the DRAM macro cells for data storage, large storage capacity can be realized.

Writing and reading are effected on the SRAM8 directly from outside. When the SRAM8 is mishit, access to any of the SRAM0 through SRAM7 is made. When a mishit is further made, access to any of the DRAM0 through DRAM7 is made. That is, the SRAM8 is operated as a level1 cache, the SRAM0 through SRAM7 are operated as a level2 cache, and the DRAM0 through DRAM7 are operated as a level3 cache. A control operation for discriminating hit/mishit of these is performed by the logic circuit LC that constitutes a cache control circuit.

Figure 11:
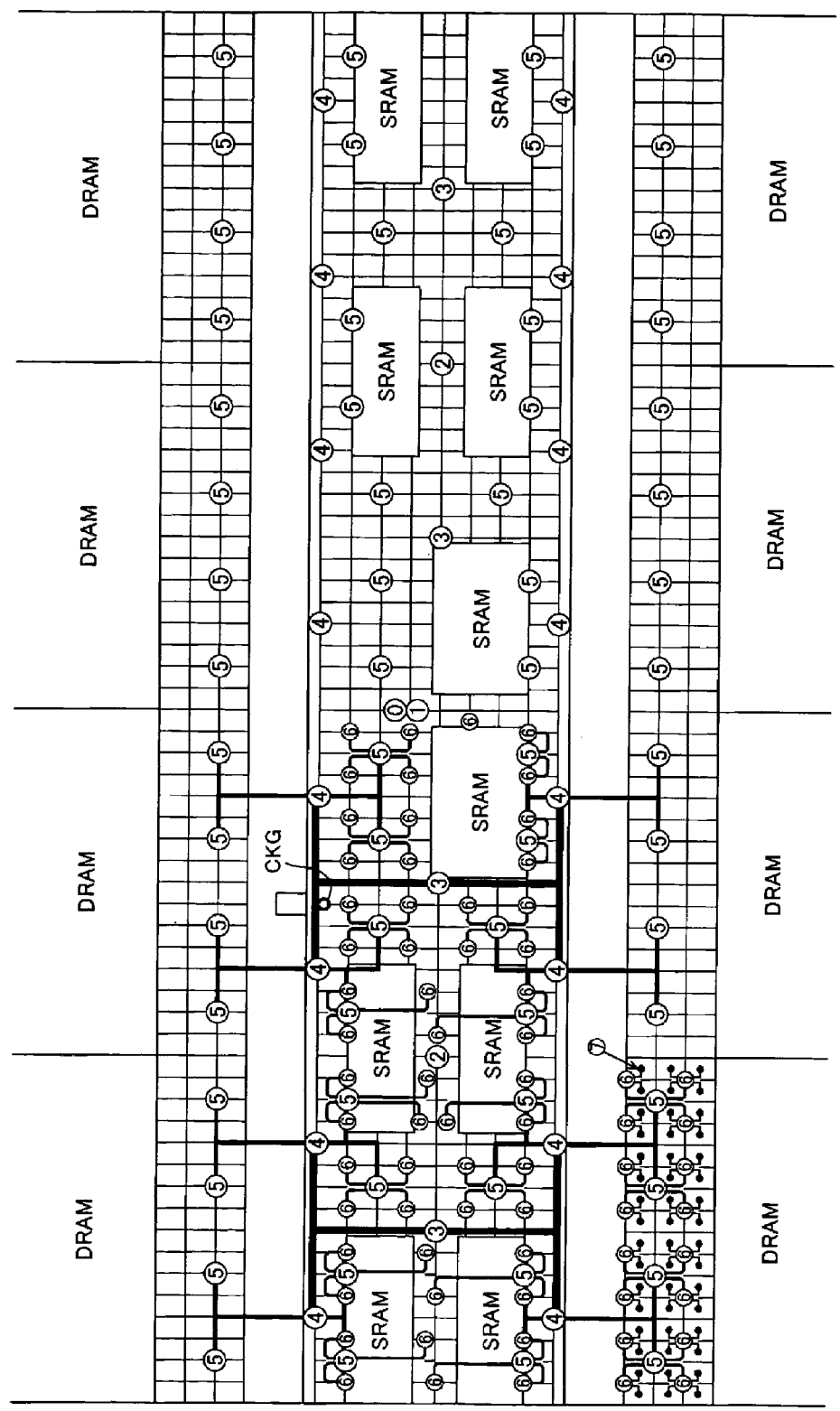
FIG. 11 is a layout diagram depicting one embodiment illustrative of gate array sections and SRAM sections of the logic embedded memory LSI shown in FIG. 10.

A layout diagram of one embodiment illustrative of gate array sections and SRAM sections of the logic embedded memory LSI is shown in FIG. 11. Cell-shaped gate array sections and SRAMs are disposed in the central portion of a chip interposed between the DRAMs. The two SRAMs disposed in the central portion operates as the level1 cache. The eight SRAMs constituting the level2 cache and the eight DRAMs configured as the level3 cache are provided. Some of the DRAMs are illustratively shown.

CKG indicates the clock generator. Clocks (X, Y and Z) from external terminals provided in the vicinity thereof are supplied via unillustrated selectors and clock buffers CKA and CKB. Clock buffers corresponding to a first stage are provided in the center of a semiconductor area comprising the gate array sections and the SRAM sections. Circled figures respectively indicate the numbers of stages of clock buffers. ①–⑦ correspond to the clock buffers CK1 through CK7 of FIG. 2.

Clock trees are respectively brought to an equivalent length structure so that signal transfer delay times up to the end flip-flop FF become equal to one another. That is, second-stage clock buffers indicated by ② are disposed in a central portion of the upper half of FIG. 11 and a central portion of the lower half thereof along the cells of the gate arrays from the clock buffer corresponding to a first stage. Third-stage clock buffers ③ are disposed at distances obtained by further setting the upper half and the lower half to halves respectively as viewed from the clock buffers ② corresponding to the second stage. Subsequently, clock buffers of ④–⑦ are similarly disposed, along the cells of the gate arrays, at places where the distances equivalent to halves of signal wirings of previous stages are reached. Clock trees each having a so-called H-tree structure are provided in this way.

Figure 12:
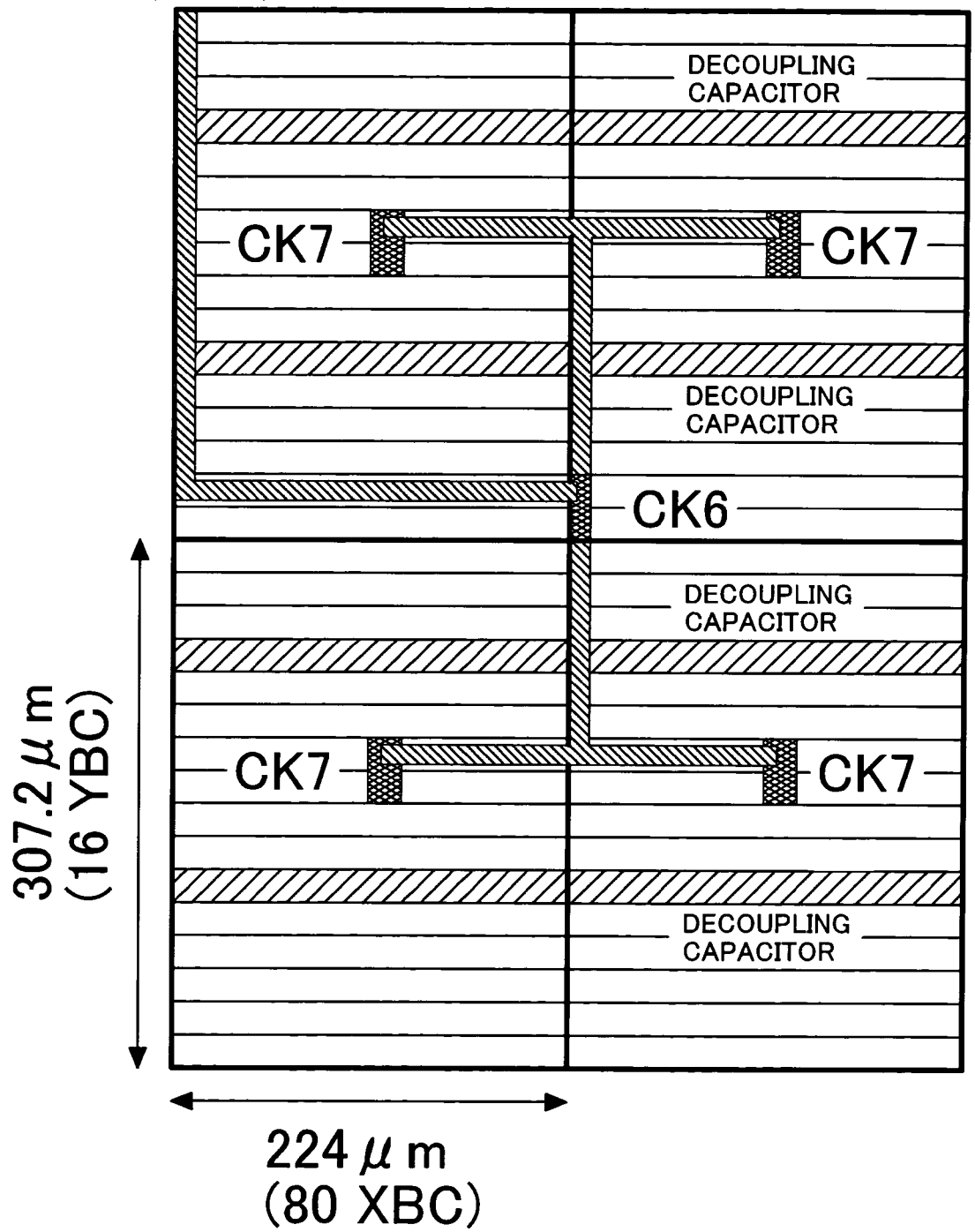
FIG. 12 is a layout diagram showing one embodiment of a logic area borne by a clock buffer CK6 shown in FIG. 11.

A layout diagram of a logic area borne by a clock buffer CK6 is shown in FIG. 12. The logic area borne by such a clock buffer CK6 is divided into four equal portions as viewed in vertical and horizontal directions. Final stage clock buffers CK7 are provided in their central portions. An area (16YBC×80XBC) with the clock buffer CK7 as the center is a minimum logic area. The clock pulses produced from the clock buffer CK7 is supplied to its corresponding flip-flops provided in such an area. In the minimum logic area, diagonally-shaped areas are used as decoupling capacitors. In addition, a plurality of areas are provided which form N channel MOSFETs and P channel MOSFETs.

The clock buffer CK5 is provided in the center of a fourfold area in which the logic area borne by the clock buffer CK6 is disposed two by two as viewed in the vertical and horizontal directions. Incidentally, the minimum areas provided on the DRAM sides in FIG. 11 are respectively slender cell structures configured as in three rows. Even in the central portion, a slender cell structure is provided as in eight rows. Thus, for example, the clock buffers CK6 provided on the DRAM side consist of two types: one provided in the center of the four as described above, and ones provided in the two equal to one-half the four. While, even in the central portion, the clock buffers ④ should originally be placed in the center of an area equal to four times an area borne by the clock buffers of ⑤, they are divided into two according to the relationship of position with the pre-stage clock buffer ③ and provided correspondingly by twice the area borne by the clock buffers of ⑤.

In such a clock tree of H-tree structure, a wiring extending from the clock buffer ① corresponding to the first stage to the clock buffer ② corresponding to the second stage is set to a relatively long length equal to about one-fourth the distances on both sides of a chip as in the same figure. A wiring extending from the clock buffer ② to the clock buffer ③ is further set to a length equal to about one-eighth the half thereof. Thus, the wiring lengths are set so as to become short in sequence. Accordingly, no matter what the drive capacity of the clock buffer ① may be made high, the rising time of a pulse becomes long due to the distributed resistance and capacitance of each wring. Therefore, when the pulse having the narrow pulse width, which is not set to the full amplitude as shown in FIG. 9, is transmitted for the AC test, the pulse will disappear at a portion long in wiring length or dispersion of delay will increase.

In contrast, if the step pulses are inputted upon the AC test as described above to form the pulses B and C each corresponding to the difference in phase therebetween at the final stage, thereby ensuring only signal transmission quality of such an extent that the continuous pulse is transmitted to the final stage, without especially increasing the signal wiring in wiring width for the purpose of the AC test or particularly enhancing the drive capacity of each clock driver for the purpose of the AC test, then the AC test can be carried out under the same condition as an actual operation.

Figure 13:
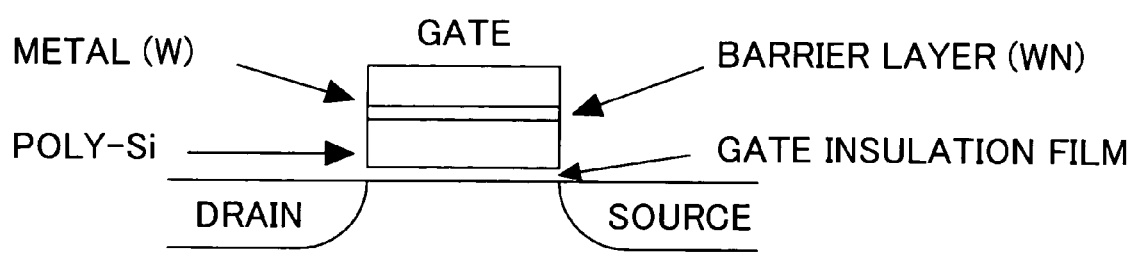
FIG. 13 is a schematic device cross-sectional view illustrating one embodiment of a MOSFET that constitutes a semiconductor integrated circuit device according to the present invention.

A schematic device cross-sectional view of one embodiment of a MOSFET that constitutes a semiconductor integrated circuit device according to the present invention is shown in FIG. 13. The MOSFET according to the present embodiment is characterized by a gate electrode. That is, the gate electrode is formed by depositing a polycrystal silicon film (poly-Si) having a thickness of about 70 nm by a CVD method, and subsequently depositing thereover a metal gate composed of a tungsten nitride film (WN) having a thickness of about 5 nm and a tungsten film (W) having a thickness of about 80 nm by a sputtering method. Although omitted in the same figure, a silicon nitride film having a thickness of about 100 nm, which is formed by the CVD method, is deposited on the metal (W).

The poly-Si is doped with an impurity such as P (phosphor) during deposition to reduce its resistance value. The WN film functions as a barrier layer which prevents a reaction (silicidation reaction) between the poly-Si gate and the metal (W) gate at an interface therebetween. The poly-Si film and the metal (W) film deposited thereover constitute a gate electrode material of the MOSFET in integral form. That is, the MOSFET according to the present embodiment is characterized in that the gate electrode material is constituted by a laminated film (polymetal film) of the poly-Si film and metal (W) film to reduce the resistance value of the gate electrode.

The use of such a MOSFET as described above is effective in reducing the resistance value of wiring for connecting between MOSFETs. It has however been cleared by investigations of the inventors of the present application that the parasitic resistance of the gate electrode in its vertical direction (in the direction of its thickness) becomes relatively large, and when the clock buffer is constituted using such a MOSFET, there is a tendency that the rising and falling edges of an output signal become slow. Therefore, when the invention of the present application is applied to a semiconductor integrated circuit device in which each circuit is made up of such MOSFETs, an arbitrary pulse having a pulse width shorter than a rising time up to the full amplitude of a waveform at a signal path can be formed with respect to an internal circuit, and an AC test or the like on a logic circuit at a high-speed operation can be simply performed.

While the invention made above by the present inventors has been described specifically based on the illustrative embodiments, the invention of the present application is not limited to the embodiments. It is needless to say that various changes can be made thereto within the scope not departing from the gist thereof. As the pulses to be inputted to each internal logic circuit or the like, for example, a narrow pulse B or C necessary for operation may be formed in addition to the pulses like the pulse B and C for the AC test. In this case, the pulses to be supplied from the external terminals may be two step signals. The present invention can be widely applied to various semiconductor integrated circuit devices in which internal circuits include signal paths each intermittently inputted with one pulse.

An advantageous effect obtained by a representative one of the inventions disclosed in the present application will be explained in brief as follows: A first signal and a second signal supplied from outside through a first signal path and a second signal path are respectively transferred to a pulse generator. When a relationship is established wherein a rising time up to the full amplitude at any one of buffers in the first signal path and the second signal path is longer than a pulse width of a pulse to be formed by the pulse generator, the difference in phase between the first signal and the second signal is caused to correspond to a pulse width of a first pulse, thereby making it possible to form a narrow pulse with satisfactory accuracy.

What is claimed is:

1. A semiconductor integrated circuit device comprising:
   a first signal path that transfers a first signal supplied from outside;
   a second signal path that transfers a second signal supplied from outside; and at least one pulse generator that forms a first pulse corresponding to a difference in phase between the first signal and the second signal in response to the first signal and the second signal,
   wherein a rising time up to full amplitude at any one of buffers in the first signal path and the second signal path is longer than a pulse width of the first pulse.

2. A semiconductor integrated circuit device according to claim 1, further comprising a third signal path supplied with a third signal from an external terminal,
   wherein the pulse generator forms a second pulse S corresponding to a difference in phase between the second signal and the third signal.

3. A semiconductor integrated circuit device according to claim 2, further comprising combination circuits and LSSD type flip-flops respectively provided on the input and output sides of the combination circuits,
   wherein the first pulse and the second pulse are capable of being used in a capture operation and a launch operation of the LSSD-type flip-flops of said each combination circuit.

4. A semiconductor integrated circuit device according to claim 3, wherein the first signal path, the second signal path and the third signal path extend in a direction parallel to each other and are placed adjacent to each other, and includes the same number of buffer stages, and
   the pulse generator outputs the first pulse and second pulse for a capture operation and a launch operation of the LSSD-type flip-flops for said each combination circuit, and clock pulses for serially transferring a test input signal and a test output signal to said each LSSD type flip-flop in a test mode, and outputs any one of the first through third signals as a clock pulse upon a normal operation.

5. A semiconductor integrated circuit device according to claim 4, wherein a clock pulse at the normal operation is transferred through a signal path interposed between two of the first signal path, the second signal path and the third signal path extended in parallel adjacent to one another.

6. A semiconductor integrated circuit device according to claim 1, wherein each of elements that constitute the buffers provided in the first and second signal paths and the pulse generator comprises a MOSFET having a metal gate structure.

7. A semiconductor integrated circuit device according to claim 1, wherein the difference in phase between the first signal and the second signal is determined from rising edges of the first and second signals.

8. A semiconductor integrated circuit device according to claim 2, wherein the difference in phase between the second and third signals is determined from rising edges of the second and third signals.

* * * * *